(12) United States Patent
He et al.

(10) Patent No.: US 9,677,719 B2
(45) Date of Patent: Jun. 13, 2017

(54) LIGHT-EMITTING DEVICE AND ILLUMINATING APPARATUS COMPRISING THE LIGHT-EMITTING DEVICE

(71) Applicant: OSRAM GmbH, Munich (DE)

(72) Inventors: Yuanyuan He, Shenzhen Guangdong (CN); Yaojun Feng, Shenzhen Guangdong (CN); Yusheng Ming, Shenzhen Guangdong (CN); Hua Wang, Shenzhen Guangdong (CN)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/406,774

(22) PCT Filed: Jun. 11, 2013

(86) PCT No.: PCT/EP2013/062006
§ 371 (c)(1),
(2) Date: Dec. 10, 2014

(87) PCT Pub. No.: WO2013/186202
PCT Pub. Date: Dec. 19, 2013

(65) Prior Publication Data
US 2015/0153009 A1    Jun. 4, 2015

(30) Foreign Application Priority Data
Jun. 11, 2012 (CN) .......................... 2012 1 0192005

(51) Int. Cl.
*H01L 33/50* (2010.01)
*F21K 99/00* (2016.01)
*F21K 9/64* (2016.01)

(52) U.S. Cl.
CPC .................. *F21K 9/56* (2013.01); *F21K 9/64* (2016.08); *H01L 33/508* (2013.01)

(58) Field of Classification Search
CPC . F21K 9/56; F21K 9/64; H01L 33/507; H01L 33/508
(Continued)

(56) References Cited

U.S. PATENT DOCUMENTS

2007/0114562 A1    5/2007  Radkov et al.
2008/0023714 A1    1/2008  Chae et al.
(Continued)

FOREIGN PATENT DOCUMENTS

CN        102237469 A     11/2011
DE    102008054029 A1      5/2010
(Continued)

OTHER PUBLICATIONS

International Search Report dated Oct. 4, 2013.
Chinese Office Action based on Application No. 201210192005.X(6 Pages and 7 pages of English translation) dated Apr. 6, 2016.

*Primary Examiner* — Karabi Guharay
(74) *Attorney, Agent, or Firm* — Viering, Jentschura & Partner mbB

(57) ABSTRACT

A light-emitting device may include a substrate, a light source arranged on the substrate, and a cover part spaced a certain distance apart from the light source and transmitting light emitted from the light source to outside. The cover part includes a first part, converting wavelengths of a part of light in light emitted from the light source and having different thicknesses at least in two different light-emitting directions of the light source, and a second part, having different thicknesses in the two different light-emitting directions to compensate the thicknesses of the first part.

13 Claims, 4 Drawing Sheets

(58) Field of Classification Search
USPC .......................................................... 362/84
See application file for complete search history.

(56) References Cited

U.S. PATENT DOCUMENTS

| | | |
|---|---|---|
| 2010/0123855 A1* | 5/2010 | Shin ................................ 349/61 |
| 2011/0228514 A1* | 9/2011 | Tong et al. ...................... 362/84 |
| 2011/0266574 A1 | 11/2011 | Liao et al. |
| 2011/0266576 A1 | 11/2011 | Engl et al. |
| 2012/0033404 A1 | 2/2012 | Wu et al. |
| 2012/0230010 A1* | 9/2012 | Kato et al. ...................... 362/84 |
| 2013/0235555 A1* | 9/2013 | Tanaka ............................ 362/84 |

FOREIGN PATENT DOCUMENTS

| | | | |
|---|---|---|---|
| JP | 2004349647 A | * | 12/2004 |
| JP | 2010225791 A | | 10/2010 |

\* cited by examiner

LIGHT-EMITTING DEVICE AND ILLUMINATING APPARATUS COMPRISING THE LIGHT-EMITTING DEVICE

RELATED APPLICATIONS

The present application is a national stage entry according to 35 U.S.C. §371 of PCT application No.: PCT/EP2013/062006 filed on Jun. 11, 2013, which claims priority from Chinese application No.: 201210192005.X filed on Jun. 11, 2012, and is incorporated herein by reference in its entirety.

TECHNICAL FIELD

Various embodiments relate to a light-emitting device and illuminating apparatus including the light-emitting device, and more particularly, to a light-emitting device emitting light with uniform chroma and illuminating apparatus including the light-emitting device.

BACKGROUND

Light sources such as LED, according to internal structure or encapsulation form thereof, usually have a certain luminous intensity spatial distribution. For instance, FIG. 2 shows an example of luminous intensity spatial distribution curve (light distribution curve) of an LED chip. As shown in FIG. 2, a luminous intensity value is the biggest in a direction of normal line (direction of 0°) in a light emergent surface of the LED chip, and as emission angle increases, the luminous intensity gradually becomes reduced, and a value in a direction of 90° is the smallest.

FIG. 3A to FIG. 3C show an example of an LED chip useful in a light-emitting device, wherein FIG. 3A is an oblique view of an LED tube 3, FIG. 3B is a cross-sectional view of the LED tube 3 in a direction perpendicular to its length direction, and FIG. 3C is a schematic diagram of light emission of the LED tube 3.

As shown in FIG. 3A and FIG. 3B, the LED tube 3 on the whole in an elongated cylindrical shape and includes a housing 31, a printed circuit board 32 arranged in the housing 31, blue LEDs 33 mounted on the printed circuit board 32 and a phosphor cover 34. The phosphor cover 34 is united with the housing 31, and partially encloses the blue LEDs 33 and is spaced an appropriate distance from the blue LEDs 33. The phosphor cover 34 has a uniform thickness and includes phosphors (not shown) that can convert blue light to yellow light. Accordingly, a part of blue light emitted from the blue LEDs 33 directly passes through the phosphor cover 34 to go outwards, and the other part of blue light is converted to yellow light by phosphors in the phosphor cover 34 and then goes outwards. Finally, the LED tube 3 emits white light obtained by mixing the blue light and the yellow light.

The technology of using a cover body including phosphors is generally called "remote phosphor" technology. In this technology, However, as THE phosphor cover spaced apart from the light source is used, and the light source usually has a certain luminous intensity spatial distribution, as mentioned above, the luminous intensities are different in different light emitting angles or different light emitting directions, the light-emitting device presents color variance indifferent light emitting angles or different light emitting directions. Explanations in conjunction with FIG. 3C are as follows. In FIG. 3C, solid arrows represent blue light, hollow arrows represent yellow light, and lateral width of the arrow schematically represents luminous intensity. As shown in FIG. 3C, the blue LEDs 33 have a luminous intensity in a first direction greater than that in a second direction, and thus, intensity of blue light emitted from the phosphor cover 34 in the first direction is greater than intensity of blue light emitted from the phosphor cover 34 in the second direction. Moreover, as the phosphor cover 34 substantially has the same phosphor concentration and cover thickness in the first direction and in the second direction, intensities of yellow light emitted from the phosphor cover 34 in the first direction and in the second direction are substantially the same. This leads to difference in luminous intensity ratios of blue light to yellow light emitted from the phosphor cover 34 in the first direction and in the second direction. The luminous intensity ratio of yellow light to blue light emitted in the first direction is relatively big, and then the color temperature is quite high, and bluish light on the whole is emitted; while the luminous intensity ratio of blue light to yellow light emitted in the second direction is quite small, and then the color temperature is very low, and yellowish light on the whole is emitted. As a result, there is color variance between light emitted from the LED tube 3 in different directions.

In order to solve this problem, a technical solution of using a phosphor cover with a non-uniform thickness is proposed. Detailed descriptions will be given hereinafter in conjunction with FIG. 4A to FIG. 4D.

FIG. 4A to FIG. 4D show another example of LED chips useful in a light-emitting device, wherein FIG. 4A is a cross-sectional view of an LED tube 4 in a direction perpendicular to its length direction, FIG. 4B is a schematic diagram of light emission of the LED tube 4, FIG. 4C is a schematic diagram of blue light path of the LED tube 4, and FIG. 4D is a schematic diagram of yellow light path of the LED tube 4. In FIG. 4C and FIG. 4D, solid-line arrows represent blue light, and dashed-line arrows represent yellow light. In the following descriptions, only differences from the example as shown in FIG. 3 will be described, and the same or similar parts will be omitted.

As shown in FIG. 4A and FIG. 4B, the LED tube 4 includes a phosphor cover 44 with a non-uniform thickness. The phosphor cover 44 has a big thickness in a first direction where a luminous intensity of the blue LEDs 43 is relatively big, and the phosphor cover 44 has a relatively small thickness in a second direction where a luminous intensity of the blue LEDs 43 is relatively small. By means of such configuration, in the first direction, most of blue light incident on the phosphor cover 44 is converted to yellow light and goes out, and in the second direction, a small part of blue light in the blue light incident on the phosphor cover 44 is converted to yellow light and goes out. Therefore, luminous intensity ratios of blue light to yellow light in light emitted in the first direction and in the second direction are modified, thereby adjusting color variance between light emitted in different directions.

However, this solution again leads to new issues. As shown in FIG. 4C, unconverted blue light penetrates through the phosphor cover 44 and goes outwards, and its propagation basically obeys law of refraction. In a situation that the phosphor cover 44 has a non-uniform thickness, emergent angles of blue light emitted from different points on alight emergent surface of the phosphor cover 44 might be different. And as shown in FIG. 4D, scattering will take place in a process of blue light exciting the phosphors for obtaining yellow light b, and the obtained yellow light b is emergent in multiple directions. Therefore, though mixture ratios of blue light to yellow light emitted in different directions is tried to be adjusted by changing the thickness of the phosphor cover 44, the change in emergent directions of blue light and yellow light due to the change of thickness causes it hard to precisely adjust the mixture ratios of blue light to yellow light emitted in various directions. Hence, that effect of color variance adjustment in this solution is undesirable. Moreover, such color variance cannot be eliminated by further changing the thickness of the phosphor cover 44, because a light path direction is also changed when the thickness is changed to eliminate the color variance so that chroma of light emitted in various directions will be changed again.

SUMMARY

Therefore, the present disclosure provides a light-emitting device capable of precisely adjusting light chroma in various directions and illuminating apparatus including the light-emitting device. The light-emitting device in accordance with the present disclosure may provide light with uniform chroma and the light-emitting performances are further improved.

In accordance with various embodiments, provided is a light-emitting device, including a substrate; a light source arranged on the substrate; and a cover part spaced a certain distance apart from the light source and transmitting light emitted from the light source to outside, and the cover part includes a first part and a second part, wherein the first part converts wavelengths of a part of light in light emitted from the light source and has different thicknesses at least in two different light-emitting directions of the light source; and the second part has different thicknesses in the two different light-emitting directions to compensate the thicknesses of the first part. By configuring the second part to compensate the thicknesses of the first part, a light path direction of light emitted from the light source can be precisely adjusted, a luminous intensity ratio of unconverted light to converted light emitted in various directions can be precisely adjusted, such that the light-emitting device can emit light with uniform chroma, and the light-emitting performances are further improved.

In various embodiments, the second part is configured upstream from the first part in the light path. In this situation, light emitted from the light source passes through the second part and the first part in sequence, so that the light path direction is adjusted before wavelength conversion, and thus, the chroma of light finally emitted can be more easily adjusted.

In various embodiments, the first part and the second part are in close contact, in which case there is no gap between the first part and the second part, i.e. only one interface is present therebetween, as a result, computation of thickness configuration of the first part and the second part is reduced, and the luminous efficiency is improved.

In various embodiments, the first part includes a substrate and phosphors dispersed in the substrate, and the second part has a refractive index the same as that of the substrate. In this context, compensatory thicknesses in demand can be more easily configured.

Further, the second part may be made from a material the same as that of the substrate, and the second part is free from phosphor, in which situation compensatory thicknesses in demand can be more easily configured.

In various embodiments, the first part has a non-uniform thickness corresponding to a luminous intensity spatial distribution of the light source. In this case, the thickness of the first part can be determined in accordance with the luminous intensity spatial distribution of the light source, and thereby computation of thickness configuration of the first part can be simplified.

Further, the thickness of the second part may depend upon the thickness of the first part. In this situation, there is no need to adjust the thicknesses of the second part and the first part in coordination, and the configuration is thus simple.

In various embodiments, a sum of the thickness of the first part and the thickness of the second part is a fixed value. In this situation, uniform light chroma can be simply achieved, without simulated computation or practical experiment.

In various embodiments, the light source is blue LEDs, and the first part includes phosphors converting blue light to yellow light such that the light-emitting device emits white light. Thus, the light-emitting device emitting white light with uniform chroma can be obtained.

In various embodiments, the light source is ultraviolet LEDs, and the first part includes phosphors converting ultraviolet to visible light such that the light-emitting device emits visible light. Thus, the light-emitting device emitting visible light with uniform chroma can be obtained.

In various embodiments, a light transmission material is filled between the cover part and the light source. The light transmission material, for instance, can have heat-conducting property so as to dissipate heat generated by the light source.

In various embodiments, the cover part partially encloses the light source, and a light incident surface or a light emergent surface of the cover part is a part of a cylindrical surface, a part of a spherical surface or a part of an ellipsoid surface. As a result, the light-emitting device can be used independently, for example, it can be useful as illuminating apparatus.

In various embodiments, a light incident surface or a light emergent surface of the cover part is a plane. Accordingly, a plurality of light-emitting devices can be used jointly in combination, for instance, a plurality of light-emitting devices can be used as plane illuminating apparatus, a backlight device of a display device.

In various embodiments, the first part and the second part are made in one piece. In this case, the fabrication of the cover part is simplified, and the manufacturing cost of the light-emitting device is reduced.

Further, the first part and the second part are made through a bi-material injection process or a bi-material extrusion process. Therefore, the first part and the second part can be made in one piece through a simple process.

In accordance withinvent various embodiments, provided is illuminating apparatus, including the light-emitting device as mentioned above. The illuminating apparatus can provide light with uniform chroma, and light-emitting performances are further improved.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "upper", "lower", is used in reference to the orientation of the figures being described. Because components of embodiments of the present disclosure can be positioned in a number of different orientations, the directional terminology is used for purposes of illustration and is in no way limiting. It is to be understood that other embodiments may be utilized and structural or logical changes may made without departing from the scope of the present disclosure. The following detailed description, therefore, is not to be taken in a limiting sense, and the scope of the present disclosure is defined by the appended claims.

Figure 1:
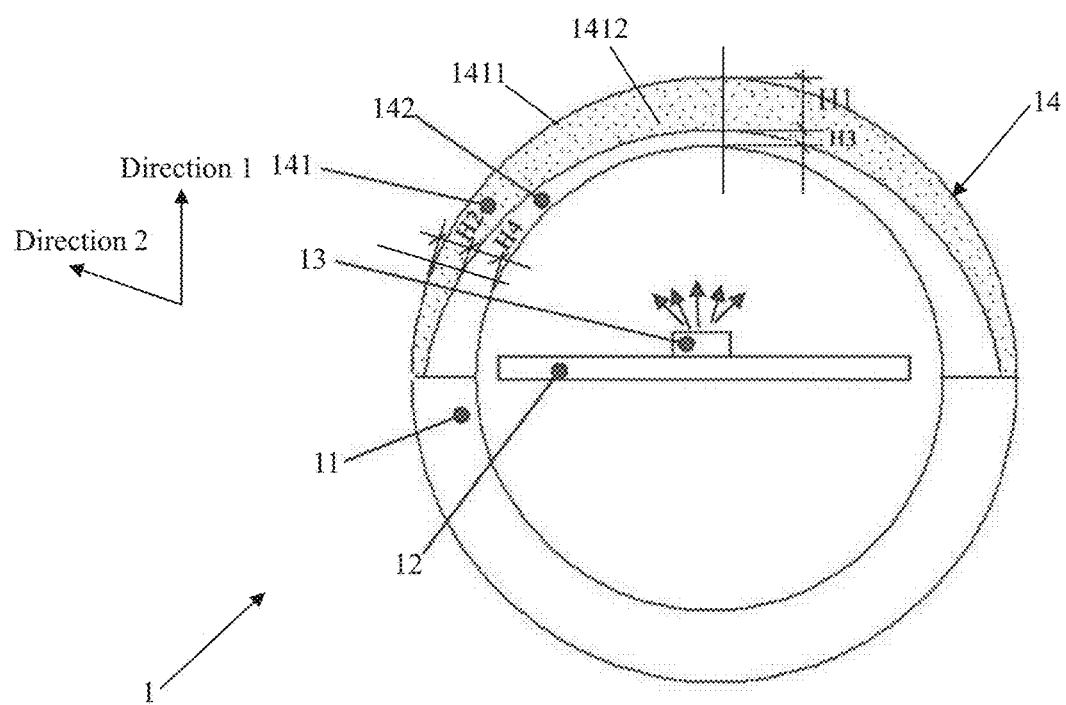
FIG. 1 is a cross-sectional view of one embodiment of a light-emitting device in accordance with the present disclosure.
Figure 2:
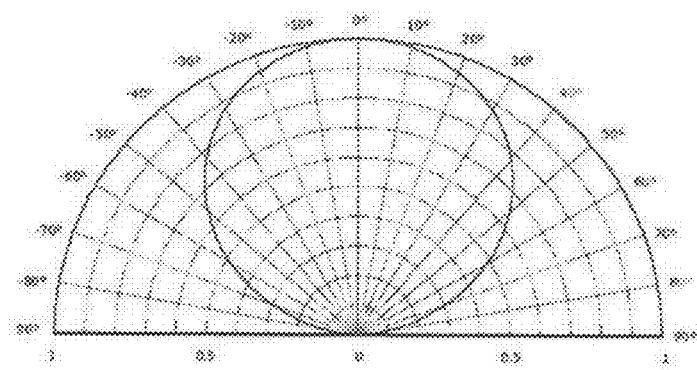
FIG. 2 is a schematic diagram of an example of a luminous intensity spatial distribution curve of an LED chip.
Figure 3A:
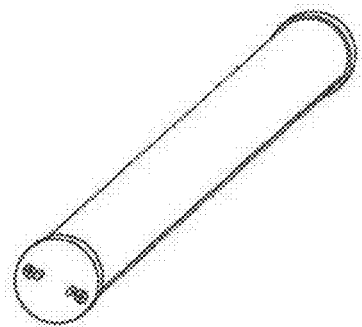
FIG. 3A to FIG. 3C are schematic diagrams of an example of LED chips used in a light-emitting device.
Figure 3B:
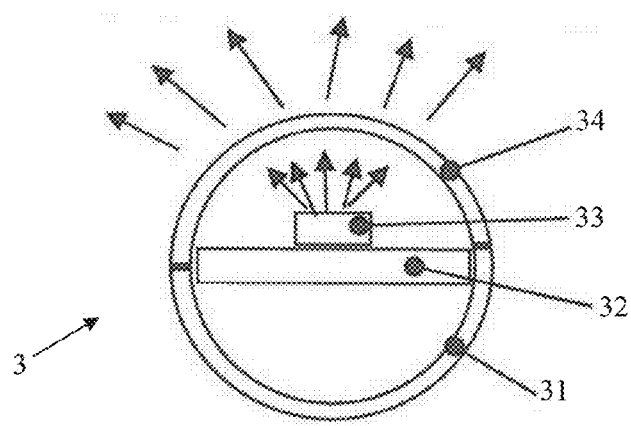
Figure 3C:
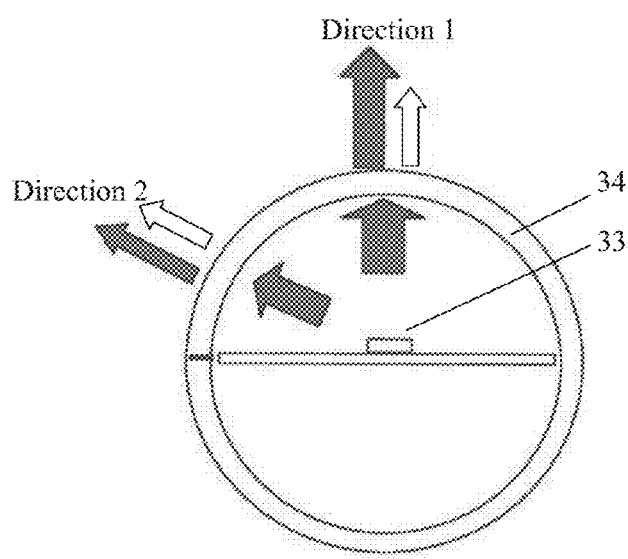

FIG. 1 is a cross-sectional view of one embodiment of a light-emitting device 1 in accordance with the present disclosure. For instance, the light-emitting device 1 can be various light-emitting devices, e.g. of tube type, bulb type, ceiling-lamp type, planarized type. FIG. 1 shows an example of a tube type light-emitting device.

As shown in FIG. 1, one embodiment of the light-emitting device 1 in accordance with the present disclosure includes a housing 11, a printed circuit board 12, LEDs 13 arranged on the printed circuit board 12 and a cover part 14 spaced a distance apart from the LEDs 13 and transferring light from the LEDs 13 to the outside. The cover part 14 includes a phosphor part 141 and a light transmission part 142.

Intensity of light emitted in a first direction from the LEDs 13 is bigger than intensity of light emitted in a second direction from the LEDs 13. The phosphor part 141 converts wavelengths of a part of light in light emitted from the LEDs 13, and has a thickness H1 in the first direction and a thickness H2 smaller than H1 in the second direction. The light transmission part 142 has a thickness H3 in the first direction and a thickness H4 bigger than H3 in the second direction so as to compensate thickness change of the phosphor part 141.

The LEDs 13 can be, for instance, blue LEDs, purple LEDs, ultraviolet (near-ultraviolet) LEDs, and emission wavelengths thereof are, for example, 400~470 nm or 300~400 nm. Of course, the LEDs 13 also can be LEDs that emit light of other colors, such as red light and green light. One or more LEDs that emit light of the same or different colors can be arranged on the printed circuit board 12. In the present embodiment, blue LEDs are takes as an example of the LEDs 13.

The phosphor part 141 includes a substrate 1411 and phosphors 1412 dispersed in the substrate 1411. The substrate can be of various common resin materials and glass materials, such as PET, PC, PMMA and silicon. The phosphors 1412 can includes various common phosphors, for instance, the phosphors 1412 can includes phosphors converting blue light to yellow light, or includes phosphors converting blue light to green light and phosphors converting blue light to red light, such that the light-emitting device 1 emits white light when the blue LEDs are used as the light source. Alternatively, the phosphors 1412 can includes phosphors converting ultraviolet to red light, phosphors converting ultraviolet to green light and phosphors converting ultraviolet to blue light, such that the light-emitting device 1 emits white light when ultraviolet (near-ultraviolet) LEDs are used as light source. In the present embodiment, phosphors converting blue light to yellow light are taken as an example of the phosphors 1412.

The light transmission part 142, for instance, can have a refractive index the same as that of the substrate 1411. The light transmission part 142, for instance, can be made from a material the same as that of the substrate 1411. The light transmission part 142 generally includes no phosphor, in which situation, as the light transmission part 142 and the substrate 1411 have the same refractive index and/or the light transmission part 142 includes no phosphor, it is favorable for controlling directions of light transmitted from the light transmission part 142 and the phosphor part 141.

Concerning the configuration of the thickness of the light transmission part 142, for instance, firstly the thickness of the phosphor part 141 depends upon the luminous intensity spatial distribution of the LEDs 13, and then the thickness of the light transmission part 142 is determined in accordance with the thickness of the phosphor part 141. For example, the phosphor part 141 can be configured to have a non-uniform thickness corresponding to the luminous intensity spatial distribution of the LEDs 13. Specifically, in the present embodiment, the LEDs 13 have a big luminous intensity in the first direction, and then the thickness H1 of the phosphor part 141 is configured to be big in the first direction; and the LEDs 13 have a small luminous intensity in the second direction, and then the thickness H2 of the phosphor part 141 is configured to be small in the second direction. As a result, yellow light obtained by exciting the phosphors 1412 by the blue light has a bigger intensity in the first direction than that in the second direction. After the thickness of the phosphor part 141 is determined, the light transmission part 142 is added to change the light path direction. In the present embodiment, the light transmission part 142 is configured to locate upstream from the phosphor part 142 in the light path and in close contact with the phosphor part 141. In this situation, since the light path direction of blue light emitted from the light transmission part 142 can be precisely adjusted by changing the thickness of the light transmission part 142, a light mixing ratio (light intensity ratio) of light finally emitted in the first direction and in the second direction is adjusted by changing the thickness of the light transmission part 142 in a manner of simulated computation or practical experiment, and preferably, a light mixing ratio of blue light to yellow light finally emitted in the first direction is enabled to be substantially the same as a light mixing ratio of blue light to yellow light finally emitted in the second direction. Accordingly, the light-emitting device 1 can emit white light with uniform chroma and the light-emitting performances are improved.

FIG. 1 shows a case where the light transmission part 142 and the phosphor part 141 are in close contact, in which the light transmission part 142 and the phosphor part 141 can be formed separately, which is favorable for thickness compensation for the light-emitting device that has been fabricated and has a phosphor cover so as to improve the uniformity of light chroma, and the light transmission part 142 and the phosphor part 141 also can be formed in one piece, which is advantageous for reducing fabrication steps and reducing manufacturing cost. For the one-piece manufacturing method, a bi-material injection process or a bi-material extrusion process can be used. In the case where the light transmission part 142 and the phosphor part 141 are in close contact, only one interface is present between the two, and thereby computation amount of thickness configuration is reduced. Optionally, the light transmission part 142 and the phosphor part 141 also can be configured spaced from each other according to configuration requirements.

FIG. 1 shows a case where the light transmission part 142 and the phosphor part 141 are arranged in sequence on the light path. Optionally, the phosphor part 141 also can be arranged upstream from the light transmission path 142 in the light path, in which situation, since the chroma spatial distribution of light emitted from the phosphor part 141 can be pre-determined, a light mixing ratio of light finally emitted in the first direction and in the second direction also can be adjusted by changing the thickness of the light transmission part 142. Preferably, the light transmission part 142 can be arranged at the side of a surface that has an abrupt curvature in two surfaces of the phosphor part 141. As incident angles (emergent angles) of light emitted from the LEDs 13 to different directions are significantly different on the surface that has the abrupt curvature, to arrange the light transmission part 142 at the side of this surface can be more favorable for changing the light path direction of light emitted from this surface (interface).

Simply, the thickness of the light transmission part 142 can be configured in such a manner that a sum of thicknesses of the phosphor part 141 and the light transmission part 142 is a fixed value. In the present embodiment, for instance, it is set H1+H3=H2+H4. In this situation, the light path direction of light passing through the light transmission part 142 can be simply adjusted so as to modify a light mixing ratio of blue light to yellow light finally emitted in the first direction and in the second direction and to obtain uniform chroma.

Concerning the thickness configuration of the light transmission part 142, for instance, the thickness of the phosphor part 141 and the thickness of the light transmission part 142 can be configured in coordination in accordance with the luminous intensity spatial distribution of the LEDs 13. Specifically, the light mixing ratio of blue light to yellow light in various directions is adjusted by changing thickness of the phosphor part 141, and the light path direction is modified by changing the thickness of the light transmission part 142, so as to obtain light with uniform chroma or light with desired chroma distribution. Moreover, since the light path direction can be precisely adjusted by changing the thickness of the light transmission part 142, the chroma distribution of light emitted from the phosphor part 141 can be precisely adjusted.

Figure 4A:
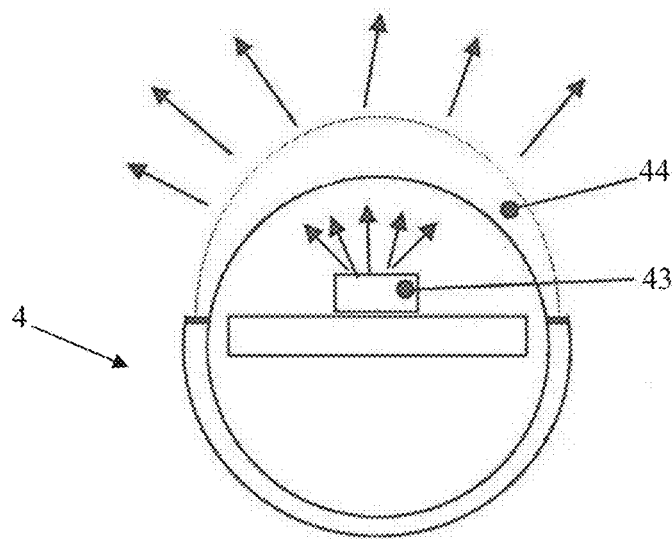
FIG. 4A to FIG. 4D are schematic diagrams of another example of LED chips used in a light-emitting device.
Figure 4B:
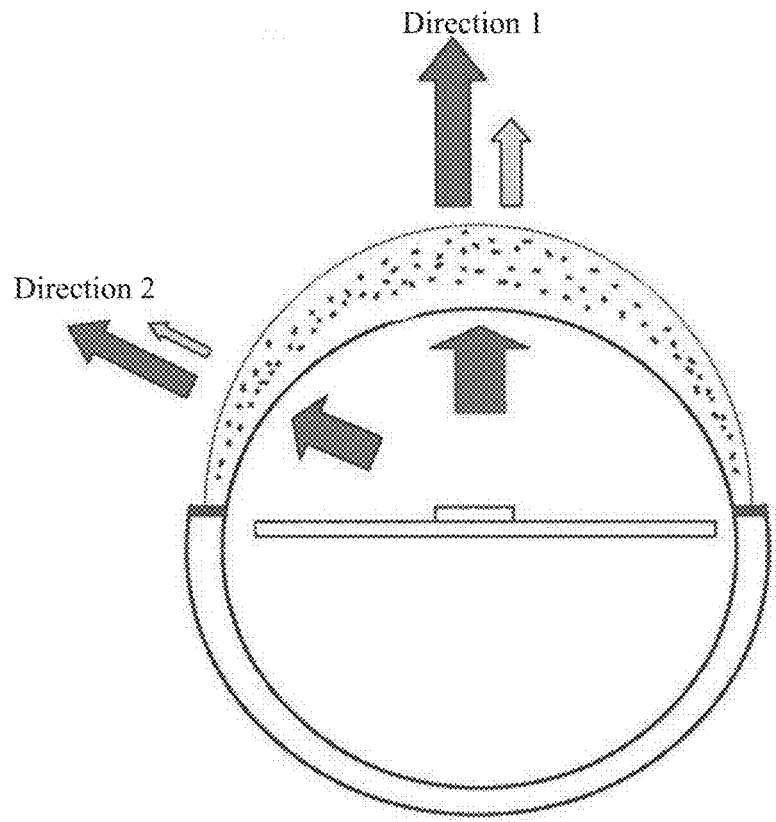
Figure 4C:
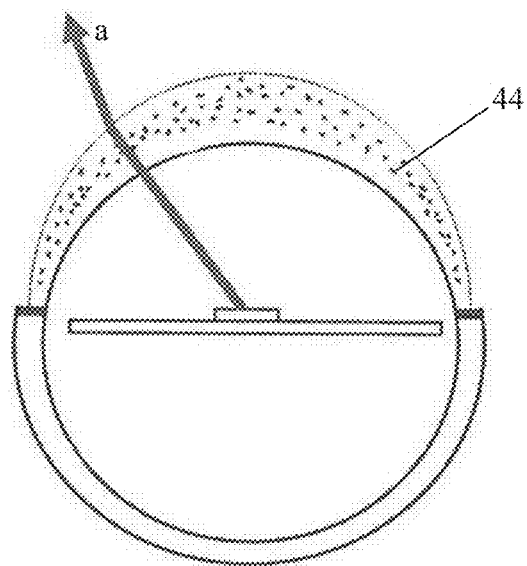
Figure 4D:
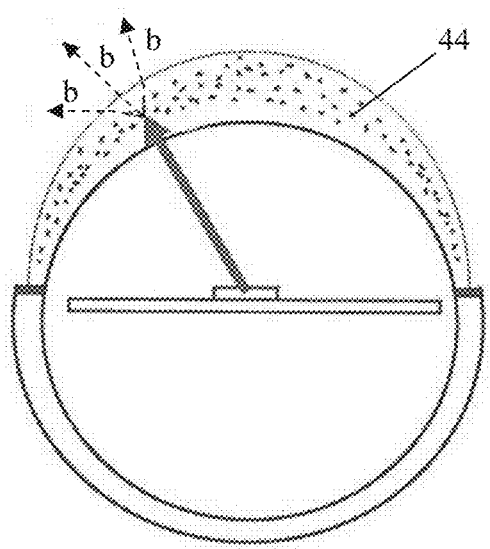

In the present embodiment, the cover part 14 partially encloses the LEDs 13, and a light incident surface or a light emergent surface thereof is a part of a cylindrical surface. In the above, a light incident surface of the phosphor part 141 (i.e. a light emergent surface of the light transmission part 142) is approximately a part of an elliptic cylindrical surface, a light incident surface of the light transmission part 142 and a light emergent surface of the phosphor part 141 each are approximately a part of a cylindrical surface. But the present disclosure is not limited to this. For example, the phosphor part 141 also can be configured to have a shape substantially the same as that of the phosphor cover 44 as shown in FIG. 4A, and a light incident surface thereof is approximately a part of a cylindrical surface, and a light emergent surface thereof is approximately a part of an elliptic cylindrical surface. In this situation, the thickness of the light transmission part 142 can be configured in a manner the same as the above-mentioned. In addition, according to configuration requirements, the light incident surface or the light emergent surface of the cover part 14 also can be a part of a spherical surface, a part of an ellipsoid surface or an optical surface in other shape. Optionally, the light incident surface or the light emergent surface of the cover part 14 also can be a plane, in which situation, a plurality of light-emitting devices 1 can be arranged in a matrix form into a plane light source useful as plane illuminating apparatus, a backlight device of a display device, etc. Correspondingly, the light incident surfaces and the light emergent surfaces of the phosphor part 141 and the light transmission part 142 each can be a part of a cylindrical surface, a part of spherical surface, a part of an ellipsoid surface, a plane or an optical surface in other shape.

In the present embodiment, the printed circuit board 12 is used as a substrate for carrying the blue LEDs 13, but not limited to this. The substrate can be, for instance, metal substrate, ceramic substrate, resin substrate. The substrate can have light transmittance such that nearly 360° light emission can be realized by arranging bi-directional light-emitting components on one surface thereof. A plurality of blue LEDs 13 can be arranged on both surfaces of the printed circuit board 12, such that nearly 360° light emission is achieved. On the contrary, one surface of the printed circuit board 12 where the blue LEDs 13 are arranged can have reflective property or have a reflective layer provided thereon to improve unilateral light-emitting intensity.

The present embodiment takes, but not limited to, LEDs 13 as an example of the light source. For example, the light source can be a solid light source such as light-emitting diode (LED), organic light-emitting device (OLED) and laser diode (LD), and if necessary, light sources of other various types also can be used. According to configuration requirements, the light source can emit light having various wavelengths, e.g. red light, green light, blue light, purple light and ultraviolet. Light sources emitting light of different colors can be used in combination.

A light transmission material (not shown) can be filled between the cover part 14 and the LEDs 13. The light transmission material is, for instance, a transparent material, such as silica gel, having heat dissipating properties, so as to conduct heat generated by the LEDs 13.

The light-emitting device 1 can be used for illuminating apparatus, etc. so as to obtain illumination with uniform chroma. In addition, light with desired chroma distribution also can be obtained by adjusting the thicknesses of the phosphor part 141 and the light transmission part 142 according to configuration requirements.

It is to be understood that the features of the various exemplary embodiments described herein may be combined with each other, unless specifically noted otherwise In addition, while a particular feature or aspect of an embodiment of the disclosure may have been disclosed with respect to only one of several implementations, such feature or aspect may be combined with one or more other features or aspects of the other implementations as may be desired and advantageous for any given or particular application.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

1 light-emitting device
3, 4 LED tube 11, 31 housing
12, 32 printed circuit board
13 LED
33, 43 blue LED
14 cover part
34 phosphor cover
141 phosphor part
142 light transmission part
1411 substrate
1412 phosphor

The invention claimed is:
1. A light-emitting device, comprising:
a substrate;
a light source arranged on the substrate; and
a cover part spaced a certain distance apart from the light source and transmitting light emitted from the light source to outside,
wherein the cover part comprises
a first part, converting wavelengths of a part of light in light emitted from the light source and having different thicknesses at least in two different light-emitting directions of the light source; and
a second part, having different thicknesses in the two different light-emitting directions to compensate the thicknesses of the first part, wherein
the first part comprises a substrate and phosphors dispersed in the substrate and arranged on the outermost layer of the cover part,
the second part made from a material the same as that of the substrate, and the second part is free from phosphor, and
a sum of thickness of the first part and thickness of the second part is a fixed value.

2. The light-emitting device according to claim 1, wherein the second part is configured upstream from the first part in a light path.

3. The light-emitting device according to claim 1, wherein the first part and the second part are in close contact.

4. The light-emitting device according to claim 1, wherein the first part has a non-uniform thickness corresponding to a luminous intensity spatial distribution of the light source.

5. The light-emitting device according to claim 4, wherein thickness of the second part depends upon the thickness of the first part.

6. The light-emitting device according to claim 1, wherein the light source is blue LEDs, and the first part comprises phosphors converting blue light to yellow light such that the light-emitting device emits white light.

7. The light-emitting device according to claim 1, wherein the light source is ultraviolet LEDs, and the first part comprises phosphors converting ultraviolet to visible light such that the light-emitting device emits visible light.

8. The light-emitting device according to claim 1, wherein a light transmission material is filled between the cover part and the light source.

9. The light-emitting device according to claim 1, wherein the cover part partially encloses the light source, and a light incident surface or a light emergent surface of the cover part is a part of a cylindrical surface, a part of a spherical surface or a part of an ellipsoid surface.

10. The light-emitting device according to claim 1, wherein a light incident surface or a light emergent surface of the cover part is a plane.

11. The light-emitting device according to claim 1, wherein the first part and the second part are made in one piece.

12. The light-emitting device according to claim 11, wherein the first part and the second part are made through a bi-material injection process or a bi-material extrusion process.

13. Illuminating apparatus comprising a light-emitting device,
the light-emitting device comprising:
a substrate;
a light source arranged on the substrate; and
a cover part spaced a certain distance apart from the light source and transmitting light emitted from the light source to outside,
wherein the cover part comprises
a first part, converting wavelengths of a part of light in light emitted from the light source and having different thicknesses at least in two different light-emitting directions of the light source; and
a second part, having different thicknesses in the two different light-emitting directions to compensate the thicknesses of the first part, wherein
the first part comprises a substrate and phosphors dispersed in the substrate and arranged on the outermost layer of the cover part,
the second part is made from a material the same as that of the substrate, and the second part is free from phosphor, and
a sum of thickness of the first part and thickness of the second part is a fixed value.

* * * * *

UNITED STATES PATENT AND TRADEMARK OFFICE
CERTIFICATE OF CORRECTION

PATENT NO. : 9,677,719 B2
APPLICATION NO. : 14/406774
DATED : June 13, 2017
INVENTOR(S) : He et al.

It is certified that error appears in the above-identified patent and that said Letters Patent is hereby corrected as shown below:

In the Specification

Column 1, Line 63: Please delete "indifferent" and write "in different" in place thereof.

Column 2, Line 60: Please delete "alight" and write "a light" in place thereof.

Column 7, Line 50: Please delete "apart" and write "a part" in place thereof.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*